(12) United States Patent
Ono

(10) Patent No.: US 10,243,125 B2
(45) Date of Patent: Mar. 26, 2019

(54) LIGHT EMITTING DEVICE

(71) Applicant: NICHIA CORPORATION, Anan-shi (JP)

(72) Inventor: Masato Ono, Sagamihara (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/666,573

(22) Filed: Aug. 2, 2017

(65) Prior Publication Data

US 2018/0040790 A1    Feb. 8, 2018

(30) Foreign Application Priority Data

Aug. 2, 2016  (JP) .................................. 2016-151910

(51) Int. Cl.
*H01L 33/62* (2010.01)
*H01L 25/075* (2006.01)
*H01L 33/64* (2010.01)

(52) U.S. Cl.
CPC .......... *H01L 33/62* (2013.01); *H01L 25/0753* (2013.01); *H01L 33/647* (2013.01)

(58) Field of Classification Search
CPC .... H01L 25/0753; H01L 33/62; H01L 33/647
See application file for complete search history.

(56) References Cited

U.S. PATENT DOCUMENTS

| | | | |
|---|---|---|---|
| 6,069,323 A | 5/2000 | Slupek et al. | |
| 2005/0156187 A1* | 7/2005 | Isokawa ............ | H01L 23/49838 257/100 |
| 2010/0044747 A1 | 2/2010 | Tanaka | |
| 2010/0176751 A1* | 7/2010 | Oshio .................... | H01L 33/62 315/362 |
| 2011/0067911 A1 | 3/2011 | Ishikawa et al. | |
| 2011/0133217 A1 | 6/2011 | Hakamata et al. | |
| 2012/0007076 A1 | 1/2012 | Cho | |
| 2014/0021595 A1 | 1/2014 | Shirase et al. | |
| 2014/0027794 A1 | 1/2014 | Yagi et al. | |
| 2016/0133611 A1 | 5/2016 | Minoda | |

FOREIGN PATENT DOCUMENTS

| | | |
|---|---|---|
| JP | 09-107173 | 4/1997 |
| JP | 10-50734 | 2/1998 |
| JP | 2008-251936 | 10/2008 |
| JP | 2010-056399 | 3/2010 |
| JP | 2010-526425 | 7/2010 |

(Continued)

*Primary Examiner* — Syed I Gheyas

(74) *Attorney, Agent, or Firm* — Mori & Ward, LLP

(57) ABSTRACT

A light emitting device including a substrate and a conductive member array including a plurality of conductive members arranged on an upper surface of the substrate in a first direction. Each of the plurality of conductive members including a wire-connected portion, one or more coupling portions connected to the wire-connected portion, an element mounting portion connected to said one or more coupling portions, and one or more extending portions connected to the element mounting portion. Light emitting elements are respectively arranged on the element mounting portion of each of the plurality of conductive members, and bonding members respectively bond the element mounting portion to respective one of the light emitting elements.

16 Claims, 8 Drawing Sheets

(56) References Cited

FOREIGN PATENT DOCUMENTS

| | | |
|---|---|---|
| JP | 2011-216514 | 10/2011 |
| JP | 2012-094842 | 5/2012 |
| JP | 2014-022576 | 2/2014 |
| JP | 2014-042012 | 3/2014 |
| JP | 2015-032869 | 2/2015 |
| JP | 2016-096322 | 5/2016 |

\* cited by examiner

LIGHT EMITTING DEVICE

CROSS-REFERENCE TO RELATED APPLICATIONS

The present application claims priority under 35 U.S.C. § 119 to Japanese Patent Application No. 2016-151,910, filed on Aug. 2, 2016. The contents of this application are incorporated herein by reference in their entirety.

BACKGROUND

1. Technical Field

The present disclosure relates to a light emitting device.

2. Description of Related Art

Generally, light emitting devices using light emitting elements such as light emitting diodes have high light emission efficiency, low power consumption, and a long operation life, and thus are used for a light source of various devices such as an illumination device and an optical communications device. In many fields, particularly in the applications of scanners, curing of ink or resin, and bonding of panels, a light emitting device in which a plurality of light emitting elements are arranged in a line and mounted on a substrate is employed.

As an example of such a light emitting device including a plurality of light emitting elements arranged in a line and mounted on a substrate, a light emitting device is proposed in which a plurality of conductive members each including an element mounting region where a light emitting element is mounted and a wire-connected region are arranged in a line, and a light emitting element is mounted on the element mounting region of each of the plurality of conductive members (see JP 2011-216514 A). Further, in such a light emitting device, a plurality of light emitting elements is arranged with a predetermined interval in order to maintain uniform emission intensity.

However, in such a light emitting device, in the case where each of the element mounting regions and respective one of the wire-connected regions are connected to each other via a coupling portion, a bonding member for bonding of each of the light emitting elements may flow toward the coupling portion, thereby disadvantageously displacing the light emitting element from the intended mounting position. As a result, the plurality of light emitting elements may not be arranged with predetermined intervals.

Certain embodiments of the present disclosure allow for providing a light emitting device with reduced variations in intervals of a plurality of light emitting elements.

SUMMARY

A light emitting device includes: a substrate; a conductive member array including a plurality of conductive members arranged on an upper surface of the substrate in a first direction, each of the plurality of conductive members including, in order of, a wire-connected portion, one or more coupling portions connected to the wire-connected portion, an element mounting portion connected to said one or more coupling portions, and one or more extending portions connected to the element mounting portion; light emitting elements respectively arranged on the element mounting portion of each of the plurality of conductive members; and bonding members respectively bonding the element mounting portion to respective one of the light emitting elements. Each of said one or more coupling portions and respective one of said one or more extending portion extend on an identical line.

Certain embodiments of the present disclosure allow for providing a light emitting device in which variations in intervals of a plurality of light emitting elements is reduced.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION OF EMBODIMENTS

Figure 1A:
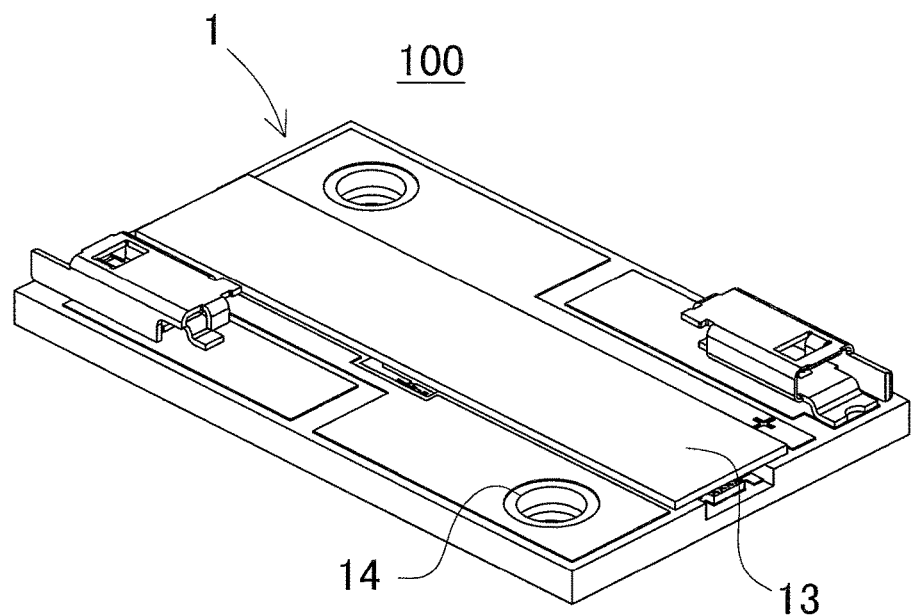
FIG. 1A is a schematic perspective view of a light emitting device according to a first embodiment of the present disclosure.

The embodiments will now be described with reference to the accompanying drawings, wherein like reference numerals designate corresponding or identical elements throughout the various drawings. The embodiments described below are intended to embody the technical idea of the present disclosure, and not intended to limit the technical scope of the present disclosure. Unless otherwise specified, a structure described in one embodiment can be also applied to other embodiments. In the following description below, terms indicating specific directions or positions may be used as necessary (for example, "upper", "lower", "right", "left" and other terms including these terms), and these terms are used for facilitating understanding of the invention with reference to the drawings, and the meaning of such terms does not limit the technical scope of the present disclosure. Also, the size, positional relationship and the like of members in the drawings may be exaggerated for the sake of clarity. Further, an element with the same reference numerals in a plurality of drawings represents the same portion or member. Further, in the present disclosure, unless otherwise specified, the terms "parallel" and "perpendicular" include the cases where two lines, sides, or surfaces defines an angle of about 0° to ±5° and about 90° to ±5°, respectively.

First Embodiment

Figure 1B:
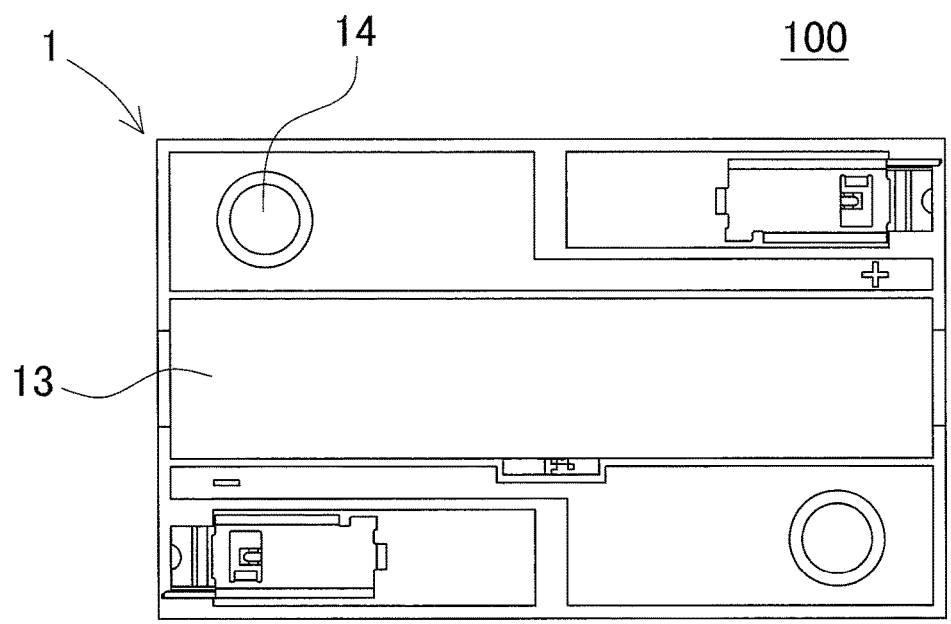
FIG. 1B is a schematic top view of the light emitting device according to the first embodiment of the present disclosure.
Figure 2:
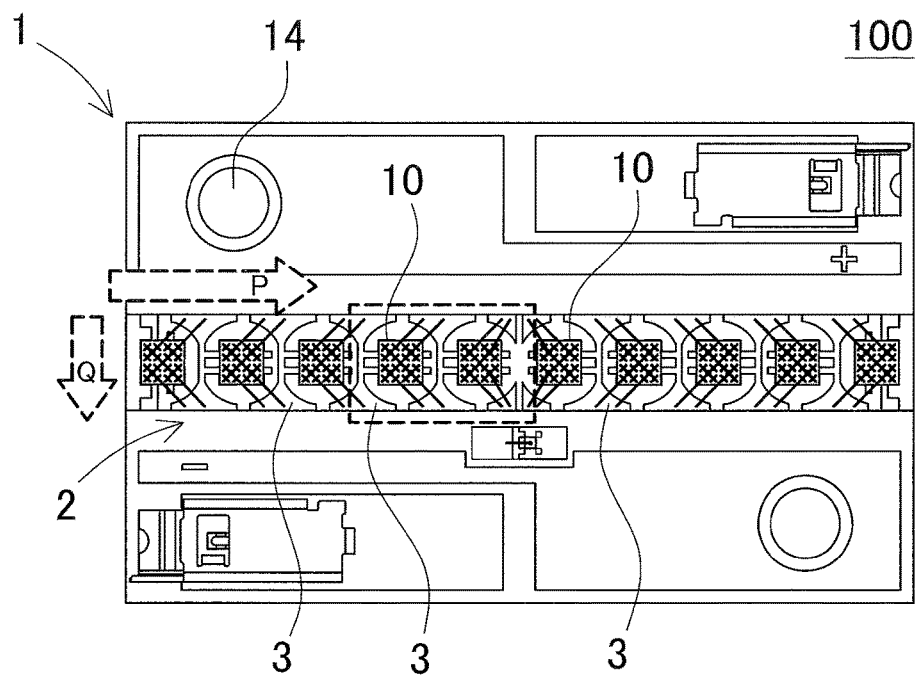
FIG. 2 is a schematic top view of the light emitting device according to the first embodiment of the present disclosure.
Figure 3A:
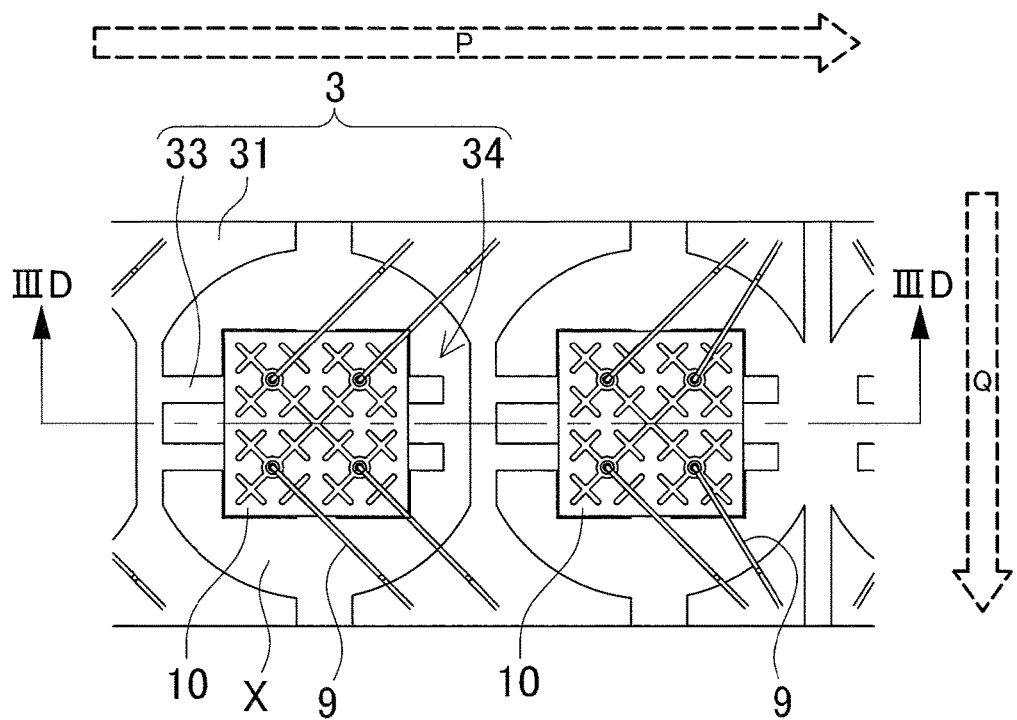
FIG. 3A is an enlarged view of a region surrounded by a broken line in FIG. 2.
Figure 3B:
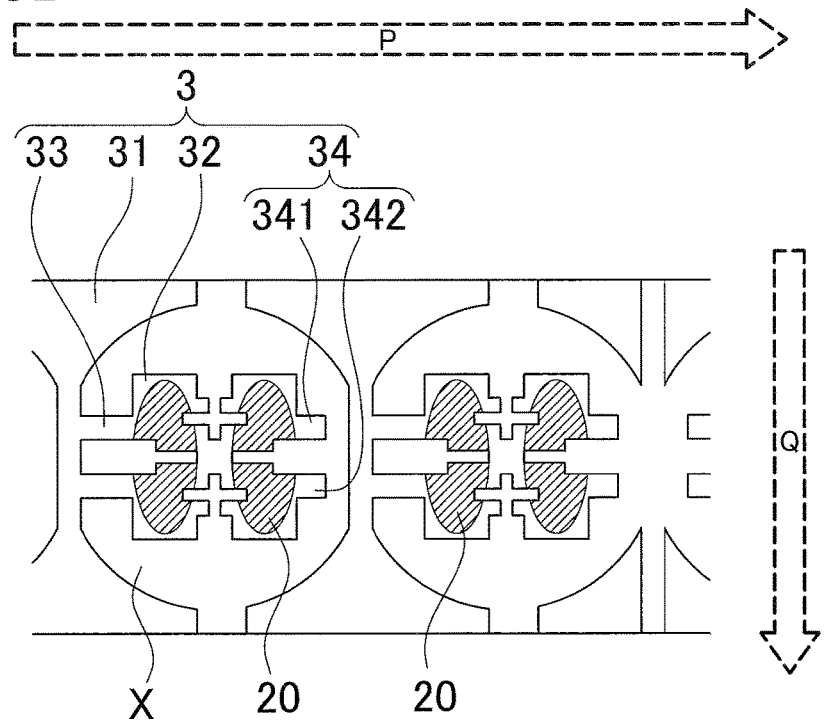
FIG. 3B is an enlarged view showing conductive members in the state where no light emitting elements are mounted in the region surrounded by the broken line in FIG. 2.
Figure 3C:
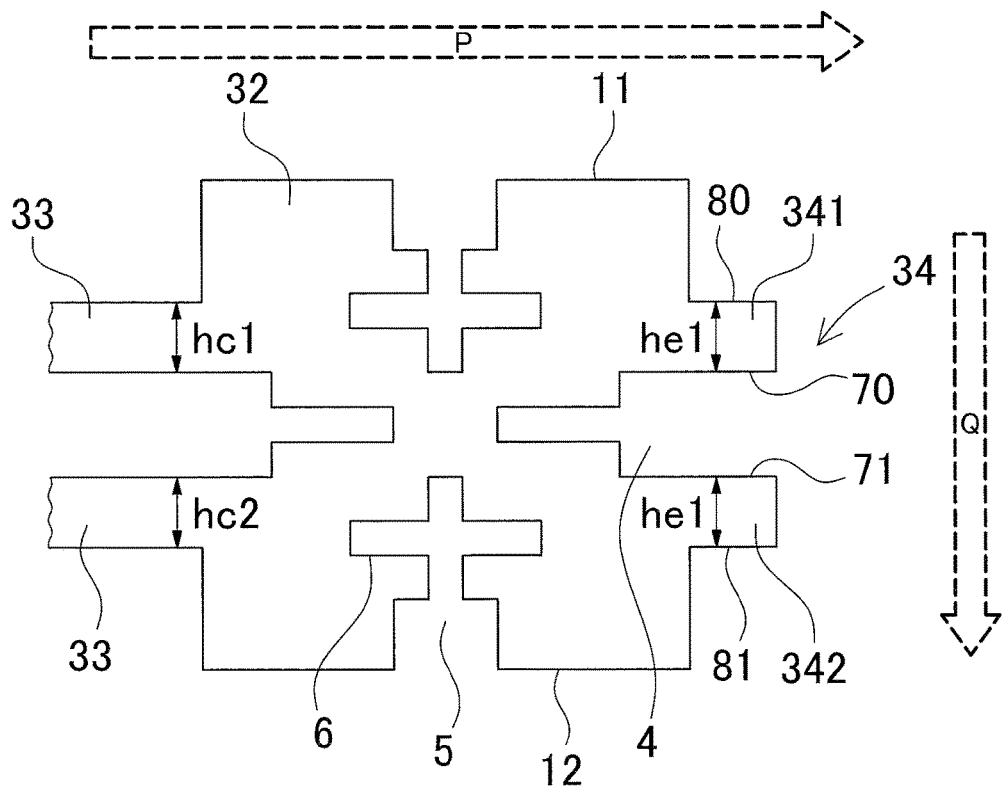
FIG. 3C is an enlarged view of an element mounting portion and its vicinity region in FIG. 3B.
Figure 3D:
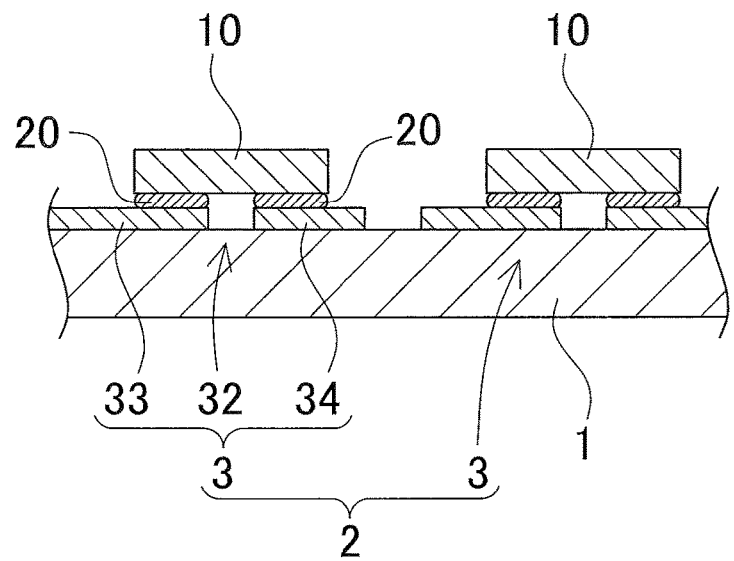
FIG. 3D is a schematic enlarged cross-sectional view taken along line IIID-IIID in FIG. 3A

FIG. 1A is a schematic perspective view of a light emitting device 100. FIG. 1B is a schematic top view of the light emitting device 100. FIG. 2 is a schematic top view showing the light emitting device 100 from which a cover part 13 is removed. FIG. 3A is an enlarged view of a region surrounded by a broken line in FIG. 2. FIG. 3B is an enlarged view of conductive members in the state where no light emitting elements are mounted in the region surrounded by a broken line in FIG. 2. FIG. 3C is an enlarged view of an element mounting portion and its vicinity region in FIG. 3B. FIG. 3D is a schematic enlarged cross-sectional view taken along line IIID-IIID in FIG. 3A. As shown in FIGS. 1A to 3D, the light emitting device 100 includes a substrate 1, a conductive member array 2 arranged on an upper surface of the substrate 1, light emitting elements 10 respectively disposed on an element mounting portion 32 of respective one of a plurality of conductive members 3 of the conductive member array 2, and wires 9 respectively connecting each of the light emitting elements 10 to respective one of wire-connected portions 31. Further, each of the light emitting elements 10 is bonded to an element mounting portion 32 of each conductive member 3 via a bonding member 20. In the below, each of the elements is described in detail.

Substrate 1

A plurality of light emitting elements 10 are mounted on the substrate 1. The conductive member array 2 is mounted on an upper surface of the substrate 1. A material, a thickness, a width, a length and the like of the substrate 1 are selected according to the usage conditions of the light emitting device 100. The substrate 1 is preferably made of a material having high thermal conductivity such as metal (e.g., copper, aluminum), ceramic such as aluminum nitride, carbon or the like. Such a material allows the substrate 1 to efficiently dissipate heat from the light emitting element 10. The substrate 1 can have a single-layer structure, or a layered structure including two or more layers. The conductive member array 2 on the upper surface of the substrate 1 is made of a conductive material such as copper by electroplating or the like. In one embodiment of the present disclosure, for the substrate 1, a plate-like substrate in which base material is made of aluminum nitride, which has high heat dissipation property, is used, and for the conductive member array 2, a base made of copper with a thin gold film on the surface thereof.

As shown in FIGS. 1A and 1B, the substrate 1 has an electronic component such as a connector for supplying electricity from an external power source. Examples of other electronic components include a capacitor, a Zener diode, and various types of transistors. With such electronic components, a light emitting device can be provided in which reliability of supplying electricity and operation can be improved.

Further, the substrate 1 can include fixing holes 14 for fixing. A screw member or the like is inserted into each of the fixing holes 14, to fix the light emitting device 100 to a mounting substrate.

Conductive Layer Array 2

The conductive member array 2 is arranged on the upper surface of the substrate 1, and includes a plurality of conductive members 3 arranged in a first direction P. The first direction P is the direction in which the plurality of light emitting elements 10 is arranged. As shown in FIG. 3B, each conductive member 3 of the conductive member array 2 includes, in order of, a wire-connected portion 31, an element mounting portion 32, coupling portions 33, and an extending portion (or controlling portion) 34. The wire-connected portion 31 is a region where wires 9 extending from the light emitting element 10 are to be connected. The element mounting portion 32 is a region where the light emitting element 10 is mounted via a bonding member 20. Further, the coupling portions 33 are connected the wire-connected portion 31 and the element mounting portion 32 to establish electrical connection between the wire-connected portion 31 and the element mounting portion 32. The extending portion 34 is connected to the element mounting portion 32 on a side opposite to the coupling portions 33 with respect to the element mounting portion 32. In the light emitting device 100, the element mounting portion 32 has a substantially rectangular outermost shape of which periphery includes four sides, in accordance with a substantially rectangular shape of each of the light emitting elements 10. Note that, the light emitting elements can have any appropriate shape such as a triangular shape or a hexagonal shape. In the present embodiment, the description is given of an exemplary case where each of the light emitting elements has a rectangular shape.

As shown in FIG. 3B, the coupling portions 33 and the extending portion 34 extend on the same straight line. The expression "the coupling portions 33 and the extending portion 34 extend on the same straight line" refers to that, in a top view, at least a portion of each of the coupling portions 33 and at least a portion of corresponding portion of the extending portion 34 overlap an imaginary single straight line.

In a light emitting device having no extending portion (or controlling portion) 34, when each of the light emitting elements 10 is mounted via a bonding member, the bonding member flows toward the coupling portions 33, pulling the light emitting element 10 toward the coupling portions 33. Accordingly, the light emitting element 10 may be displaced from a predetermined position, so that desirable intervals between the light emitting elements may not be realized. On the other hand, in the light emitting device 100 according to the present embodiment, with the coupling portions 33 and the extending portion 34 extending on the same straight line, stress pulling the light emitting element 10 toward the extending portion 34 can be generated and applied opposite to stress pulling the light emitting element 10 toward the coupling portions 33. Accordingly, misalignment of the light emitting element from a predetermined position can be reduced, so that a light emitting device with good positional precision can be provided. Note that, an insulating member X, which has a poor wettability with respect to a bonding member 20, is positioned in a second direction Q of the element mounting portion 32. Accordingly, the bonding member 20 is not easily attached onto the insulating member X. For this reason, the positional precision of the light emitting element 10 in the second direction Q is higher than that in the first direction P.

The coupling portions 33 and the extending portion 34 preferably extend in the same direction (e.g., the first direction P). This allows for improving the positional precision of each light emitting element 10 in the first direction P, and thus allows for reducing variations in the intervals of the plurality of light emitting elements in the first direction P.

Further, when viewed in a top view, each of the coupling portions 33 at a portion connected to the element mounting portion 32 preferably has a width in the second direction Q is the same with a width of the extending portion 34 connected to the element mounting portion 32 in the second direction Q. As shown in FIG. 3C, in the light emitting device 100, each of the conductive members 3 includes two coupling portions 33 and two extending portions, that is, a first extending portion 341 and a second extending portion 342. In such a case, the total width (hc1+hc2) of the coupling portions 33 in the second direction Q is preferably the same with the total width (he1+he2) of the extending portion 34 in the second direction Q. With this arrangement, an amount of a portion of the bonding member 20 flowing onto the coupling portions 33 can be substantially equivalent to an amount of a portion of the bonding member 20 flowing onto the extending portion 34, so that the stress pulling the light emitting element 10 from the coupling portions 33 side can be equivalent to the stress pulling the light emitting element 10 from the extending portion 34 side. Accordingly, the positional precision of each light emitting element 10 can be further improved.

The extending portion 34 includes a first extending portion 341 and a second extending portion 342. In the light emitting device 100 shown in FIG. 3C, the first extending portion 341 and the second extending portion 342 extend in the first direction P, and are juxtaposed to each other in the second direction Q with respect to a first recess 4. The first recess 4 extends from the outside toward the inside of the element mounting portion 32 (more specifically, toward the center of the element mounting part 32). Further, when viewed from above, the insulating member of the substrate 1 is exposed at the first recess 4. Still further, the first recess 4 reaches an inner side of the outline of the element mounting portion 32 at an end in the first direction P. The first recess 4 serves to expel voids in the bonding member applied onto the element mounting portion 32. The extending portion 34 is not limited to include two extending portions, that is, the first extending portion 341 and the second extending portion 342, and can include three or more extending portions.

Preferably, the first extending portion 341 preferably has a length in the first direction P greater than a length thereof in the second direction Q, and the second extending portion 342 preferably has a length in the first direction P greater than a length thereof in the second direction Q. When the length of the first extending portion 341 in the first direction P and that of the second extending portion 342 in the first direction P are too small, the stress that pulls the light emitting element 10 toward the extending portion 34 can be reduced. On the other hand, in the light emitting device 100 according to the present embodiment, with the first extending portion 341 and the second extending portion 342 having the above-described structure, the stress that pulls the light emitting element 10 toward the extending portion 34 can be sufficiently secured. In each of the first extending portion 341 and the second extending portion 342, the ratio between a length in the first direction P and a length in the first direction P is, for example, in a range of 1.1:1 to 2:1.

Further, in the light emitting device 100, each of the first extending portion 341 and the second extending portion 342 has a substantially rectangular shape in a top view. The first extending portion 341 has a first side 70 that faces the second extending portion 342, and the second extending portion 342 has a first side 71 that faces the first extending portion 341. The first side 70 of the first extending portion 341 is substantially parallel to the first side 71 of the second extending portion 342 with respect to the first direction P. Of the sides that define the first extending portion 341 and the second extending portion 342, the first sides 70, 71 are the sides that are nearer to an imaginal line that passes through the center of the light emitting element 10 and extends in the first direction P. By the first sides 70, 71 being parallel to the first direction P, the stress pulling in the first direction P is applied to the light emitting element 10 while reducing any possible rotation of the light emitting element 10. Further, the first extending portion 341 further has a second side 80 that is opposite to the first side 70, and the second extending portion 342 further has a second side 81 that is opposite to the first side 71. The second side 80 is substantially parallel to the second side 81 with respect to the first direction P.

The element mounting portion 32 has a substantially rectangular outermost shape having four corners, corresponding to the substantially rectangular shape of the light emitting element. The element mounting portion 32 can further include a second recess 5 in each of a region including a first peripheral portion 11 and a region including a second peripheral portion 12. In the light emitting device 100, the first peripheral portion 11 and the second peripheral portion 12 are two sides being parallel to each other with respect to the first direction P of four sides of the element mounting portion 32. The second recess 5 is positioned near the center of each of the first peripheral portion 11 and the second peripheral portion 12. Similarly to the first recess 4, the second recess 5 serves to expel voids in the bonding member applied onto the element mounting portion 32.

Further, the element mounting portion 32 preferably has grooves 6 that are respectively continuous from respective one of the second recesses 5 and each having a shape extending in the first direction P. In the light emitting device 100 in which self-alignment force of the bonding member tends to act in the first direction P, with the grooves 6 extending in the first direction P, voids generated in the bonding member can be expelled more effectively.

Light Emitting Elements 10

Each of the plurality of light emitting elements 10 is mounted on the element mounting portion 32 via a bonding member. In the light emitting device 100, a plurality of light emitting elements 10 is arranged on the substrate 1 in the first direction P. The plurality of light emitting elements 10 is preferably arranged such that the center of each of the plurality of light emitting elements 10 is positioned on the same straight line extending in the first direction P. The plurality of the light emitting elements 10 is more preferably arranged such that one side of one of light emitting element 10 with a substantially rectangular shape in a top view is parallel to one side of adjacent light emitting element 10 with a substantially rectangular shape in a top view.

For each of the light emitting elements 10, a semiconductor light emitting element such as a light emitting diode element can be used. In particular, each of the light emitting elements 10 can preferably be a nitride semiconductor light emitting element ($In_xAl_yGa_{1-x-y}N$, $0 \leq x$, $0 \leq y$, $x+y \leq 1$) that can emit light in an ultraviolet to visible light region. The plurality of light emitting elements 10 can be configured to emit light of the same wavelength, or can be configured to emit light of different wavelengths. Alternatively, some of the plurality of light emitting elements 10 can be configured to emit light of the same or different wavelengths. In the light emitting device 100, for each of the light emitting elements 10, a light emitting element having a peak light emission wavelength of, for example, 400 nm or smaller in the ultraviolet region. The light emitting device 100 in which such light emitting elements 10 of the ultraviolet region are linearly arranged is used for curing printing-purpose ink or resin, or the like.

Each of the light emitting elements 10 can be formed by, for example, layering an n-type semiconductor layer, an active layer, and a p-type semiconductor layer in order on a substrate for growth such as sapphire using Metal Organic Chemical Vapor Deposition (MOCVD) method; bonding a supporting substrate on the p-type semiconductor layer side; thereafter removing the sapphire substrate; and forming an n-electrode and a p-electrode on the n-type semiconductor layer side and the p-type semiconductor layer side, respectively, with respect to the active layer. Alternatively, a light emitting element can be employed in which the growth substrate such as sapphire is not removed and used as the supporting substrate and the n-electrode and the p-electrode are arranged on the same surface side of the light emitting element.

In each of the light emitting elements 10 shown in FIG. 3A, four pad portions of the n-electrode are located on diagonal lines of the upper surface (the light extraction surface) of the light emitting element 10. The four pad portions of the n-electrode on the upper surface of each of the light emitting elements 10 are electrically connected to the wire-connected portion 31 of adjacent one of conductive members 3 by four wires 9. More specifically, of the four pad portions of the n-electrode on the upper surface of the light emitting element 10 mounted on each of the conductive member 3, two pad portions of the n-electrode on the first peripheral portion 11 side are electrically connected to the wire-connected portion 31 of the adjacent conductive member 3 by two wires 9. Meanwhile, of the four pad portions of the n-electrode on the upper surface of the light emitting element 10 mounted on the conductive member 3, two pad parts of the n-electrode on the second peripheral portion 12 side are electrically connected to the wire-connected portion 31 of the adjacent conductive member 3 by two wires 9.

The p-electrode of each of the light emitting elements 10 is provided on a back surface (i.e., a bonding surface) of the light emitting element. The p-electrode of each of the light emitting elements 10 is bonded to respective one of the element mounting portions 32 via conductive paste such as solder. The n-electrode and p-electrode of the light emitting element 10 are formed by, for example, vapor deposition of a metal material that has small electric resistance and good resistance to corrosion, such as Au.

Figure 4:
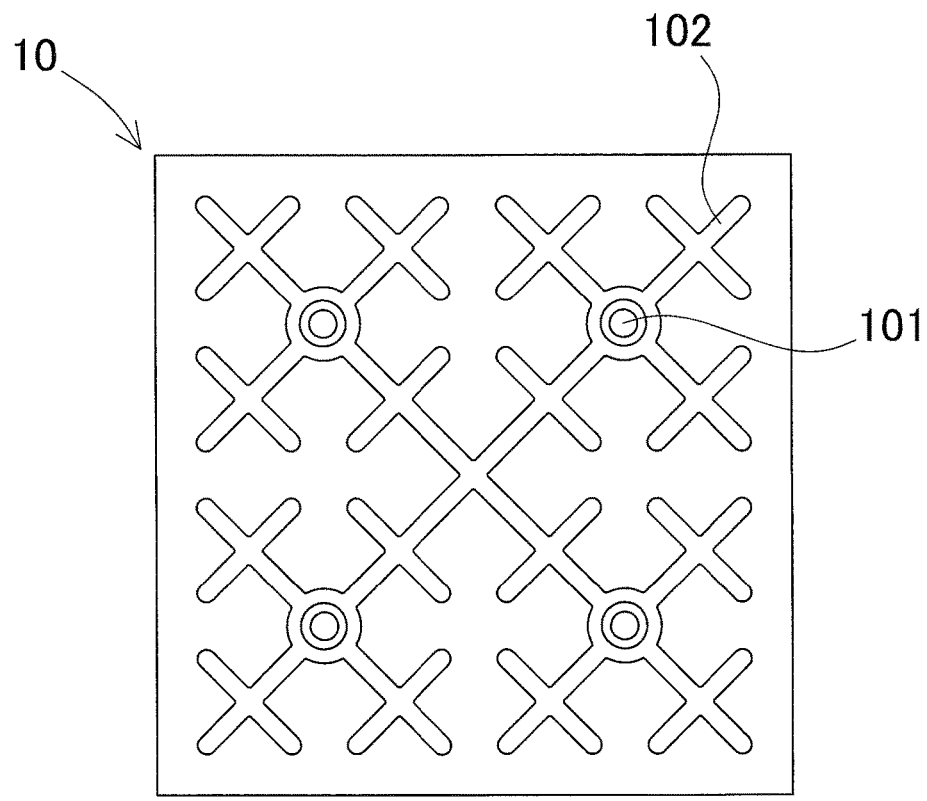
FIG. 4 is a schematic top view showing a shape of each of pad portions and an auxiliary electrode portion of a light emitting element according to the first embodiment of the present disclosure.

Further, as shown in FIG. 4, the n-electrode preferably includes pad portions 101 where wire bonding is to be performed, and an auxiliary electrode portion 102 that is continuous to the pad portions 101 and has a width smaller than that of each of the pad portions 101. With this arrangement, current supplied to the light emitting element 10 propagates, via the auxiliary electrode portion 102, to a wider area including a region far from the pad portions 101. Accordingly, light emission of almost uniform intensity can be obtained from a light emission surface of the light emitting element 10.

Further, the wires 9 preferably extend above the auxiliary electrode portion 102. In the light emitting element 10 shown in FIG. 4, the auxiliary electrode portion 102 extends from each of the pad portions 101 of the light emitting element 10 in an angle of 45 degrees with respect to the first direction P. The wires 9 are arranged above the auxiliary electrode portion 102 along the direction in which the auxiliary electrode part extends (i.e., in an angle of 45 degrees with respect to the first direction P). With the wires 9 arranged in this manner, ratio of light emitted by the light emitting element 10 and absorbed by the wires 9 can be reduced. Accordingly, a light emitting device with good light extraction is provided. Further, the wires 9 may not have the above-described structure, and can be arranged on the wire-connected portion 31 to form an angle of 90 degrees with respect to an arrangement direction of the light emitting elements 10. Such a structure allows for reducing a length of each of the wires 9, thereby reducing the risk of breakage of the wires 9. Note that, the manner of arranging the wires 9 is not limited to the manner described above, and the wires can extend in any appropriate direction and can have any appropriate length. For example, as shown in FIG. 3A, the wires can extend in a direction to form an angle of 0 to 90 degrees with respect to the arrangement direction of the light emitting elements 10.

In the description above, a light emitting element including different electrodes at an upper surface and a lower surface of the light emitting element, respectively, is employed, but the present disclosure can be applied to a light emitting element in which both of positive and negative electrodes are disposed on one of the upper surface and a lower surface of the light emitting element.

Bonding Member 20

For the bonding member 20, for example, an insulating bonding member or a conductive bonding member can be used. The insulating bonding member can be a resin, such as a transparent resin or a white resin. The conductive bonding member can be a conductive paste such as a eutectic material or solder. Examples of a preferable eutectic material include an alloy of which main components are Au and Sn, an alloy of which main components are Au and Si, or an alloy of which main components are Au and Ge. The conductive paste such as solder can be an alloy of which main components are Ag, Cu, and Sn, an alloy of which main components are Cu and Sn, or an alloy of which main components are Bi and Sn.

Cover Part

As shown in FIGS. 1A and 1B, the light emitting device 100 preferably includes the cover part 13 on the substrate. With the cover part 13, the light emitting element 10 and the conductive members 3 can be protected from dust or moisture, and breakage of wires can be prevented. The cover part 13 is made of, for example, a single-layer glass, and is disposed on the substrate via a bonding member.

Second Embodiment

Figure 5A:
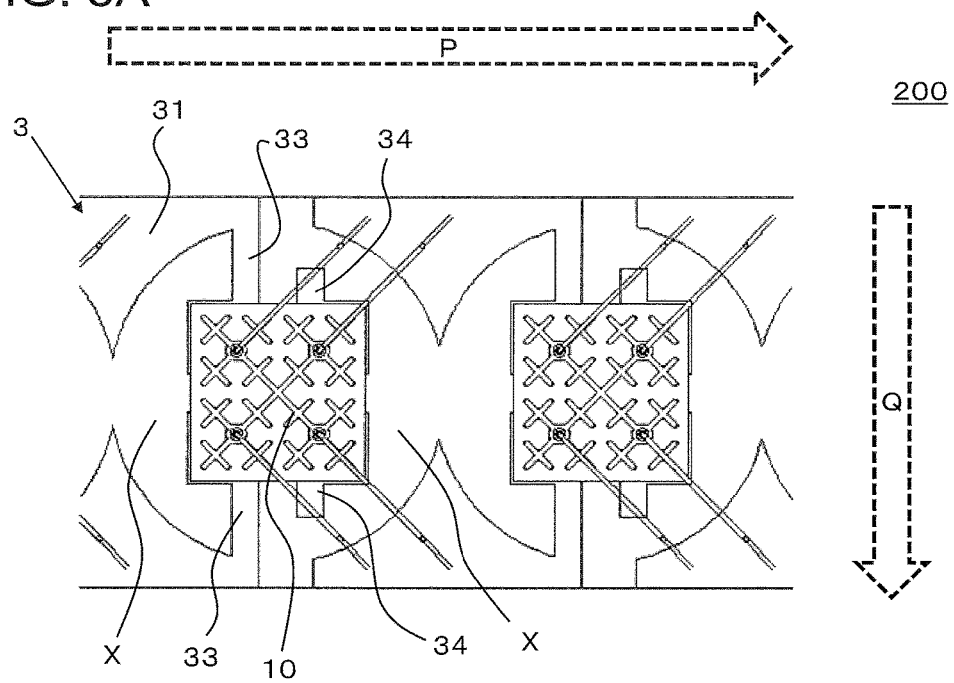
FIG. 5A is a schematic enlarged view of conductive members of a light emitting device according to a second embodiment of the present disclosure.
Figure 5B:
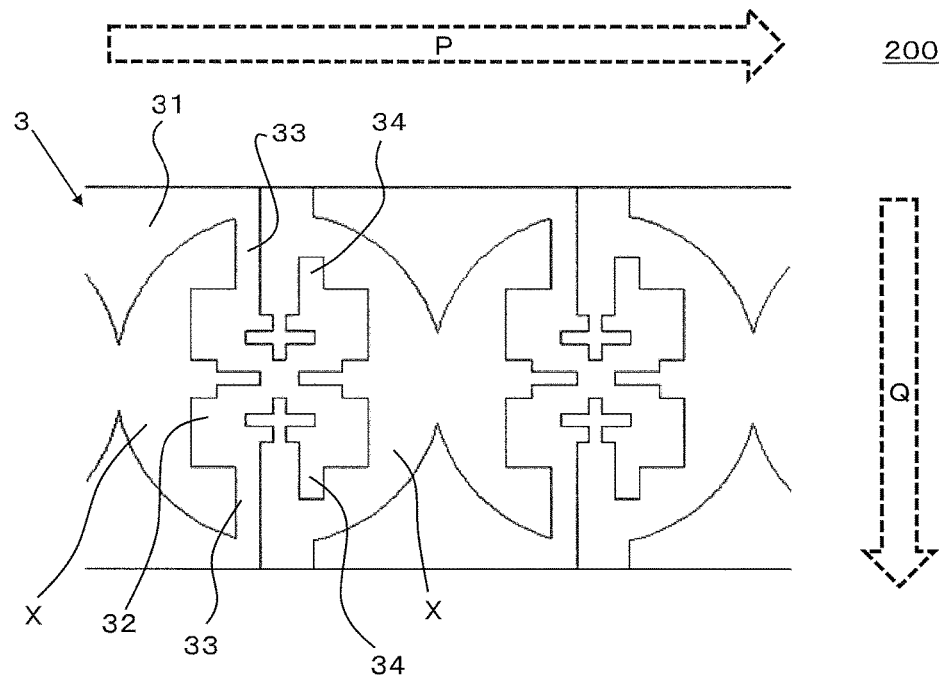
FIG. 5B is an enlarged view of the conductive members shown in FIG. 5A in a state where the light emitting elements are not arranged.

FIG. 5A is a schematic enlarged view of conductive members 3 of a light emitting device 200. FIG. 5B shows the conductive members 3 in a state where light emitting elements 10 shown in FIG. 5A are not disposed. As shown in FIGS. 5A and 5B, each of the conductive members 3 of the light emitting device 200 includes, in order of, a wire-connected portion 31, coupling portions 33 connected to the wire-connected portion 31, an element mounting portion 32 connected to the coupling portions 33, and extending portions 34 connected to the element mounting portion 32. Each of the light emitting elements 10 is mounted on the element mounting portion 32 of a corresponding one of the conductive members 3 via a bonding member 20.

The light emitting device 200 is different from the light emitting device 100 in that the coupling portions 33 and the extending portions 34 extend in the second direction Q and are arranged adjacent to each other. Each of the coupling portions 33 are coupled to the wire-connected portion 31 and the element mounting portion 32, and extend in the second direction Q between the wire-connected portion 31 and the element mounting portion 32. The extending portions 34 are coupled to the element mounting portion 32, and extend from the element mounting portion 32 in the second direction Q.

In the light emitting device 200, an insulating member X having poor wettability with the bonding member 20 is positioned in the first direction P of the element mounting portion 32. With this arrangement, the bonding member is not easily attached onto the insulating member X. Accordingly, the positional precision of the light emitting element 10 in the first direction P improves. This allows for improving the positional precision of the light emitting element 10 in the first direction P, and thus variations in intervals of the plurality of light emitting elements in the first direction P can be reduced.

The light emitting device 200 includes two coupling portions 33 and two extending portions 34. The two coupling portions 33 extend on the same straight line in the second direction Q. This allows for improving the positional precision of the light emitting element 10 in the second direction Q. Further, in the light emitting device 200, the two extending portions 34 also extend on the same straight line in the second direction Q. With this arrangement, compared with a light emitting device that does not include the extending portions 34 while including the two coupling portions 33, the self-alignment effect can be exerted at a plurality of portions, reducing any possible displacement or rotation of the light emitting element 10. Note that, while the light emitting device 200 includes two coupling portions 33 and two extending portions 34 extending in the second direction Q, the number of each of coupling portions 33 and extending portions 34 can be three or more.

Further, in the present specification, the expression "the light emitting device 200 includes, in order of, the wire-connected portion 31, the coupling portions 33, the element mounting portion 32, and the extending portions 34" refers to a state where the wire-connected portion 31 and the element mounting portion 32 are connected continuously via the coupling portions 33, and the extending portions 34 extend from the element mounting portion 32. The state where the light emitting device 200 includes, in order of, the wire-connected portion 31, the coupling portions 33, the element mounting portion 32, and the extending portions 34 is exemplarily shown in FIGS. 6A to 6C.

Figure 6A:
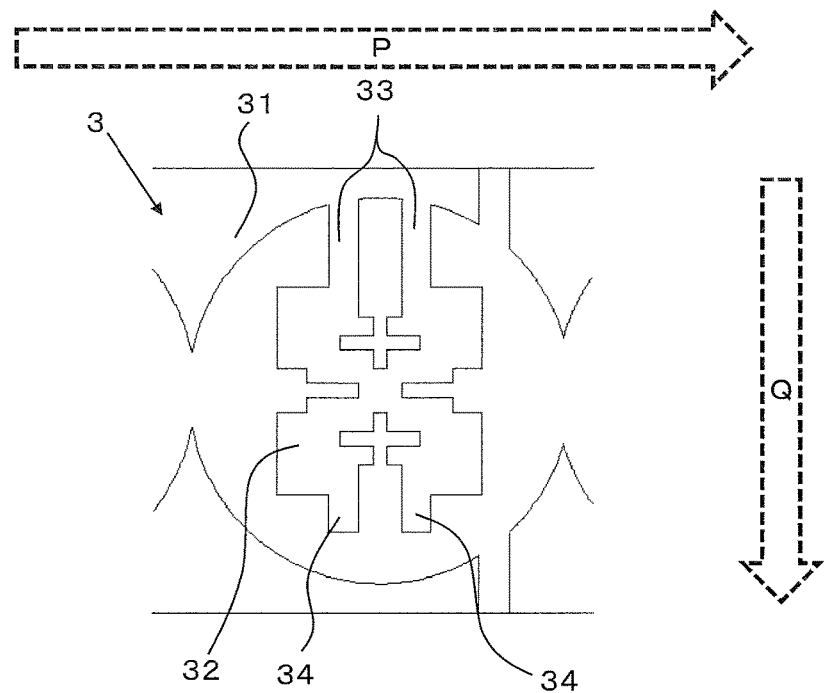
FIG. 6A is an enlarged view of the conductive members according to the second embodiment of the present disclosure.

In the conductive member 3 shown in FIG. 6A, one wire-connected portion 31 is connected to two coupling portions 33, and the two coupling portions 33 are coupled to the element mounting portion 32. The coupling portions 33 and the extending portions 34 extend in the second direction Q on the same straight line.

Figure 6B:
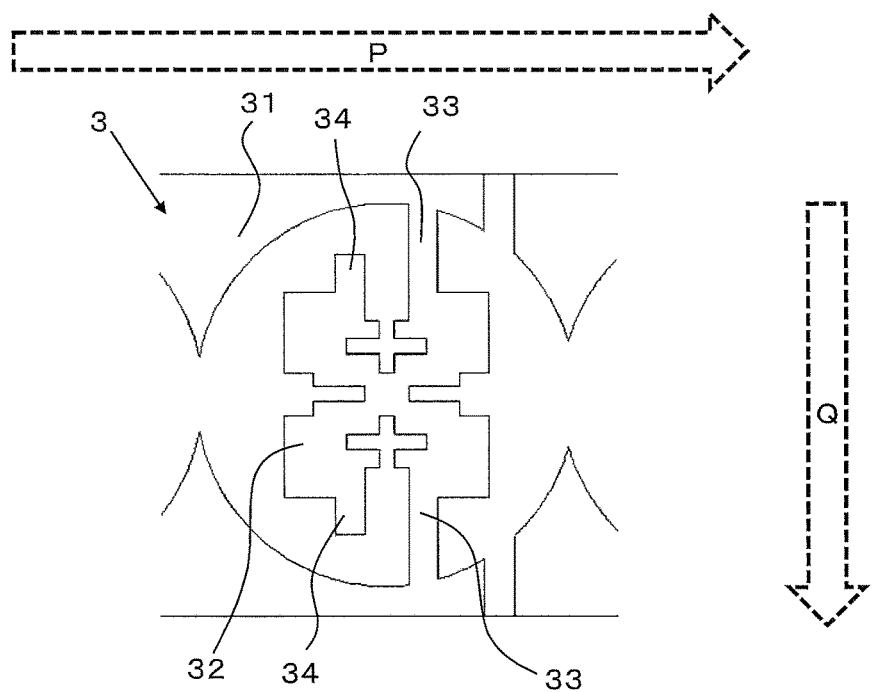
FIG. 6B is an enlarged view showing the conductive members according to the second embodiment of the present disclosure.

In the conductive member 3 shown in FIG. 6B, two wire-connected portions 31 are coupled to the element mounting portion 32 via respective ones of the coupling portions 33. The two coupling portions 33 extend on the same straight line in the second direction Q, and the two extending portions 34 extend on the same straight line in the second direction Q.

Figure 6C:
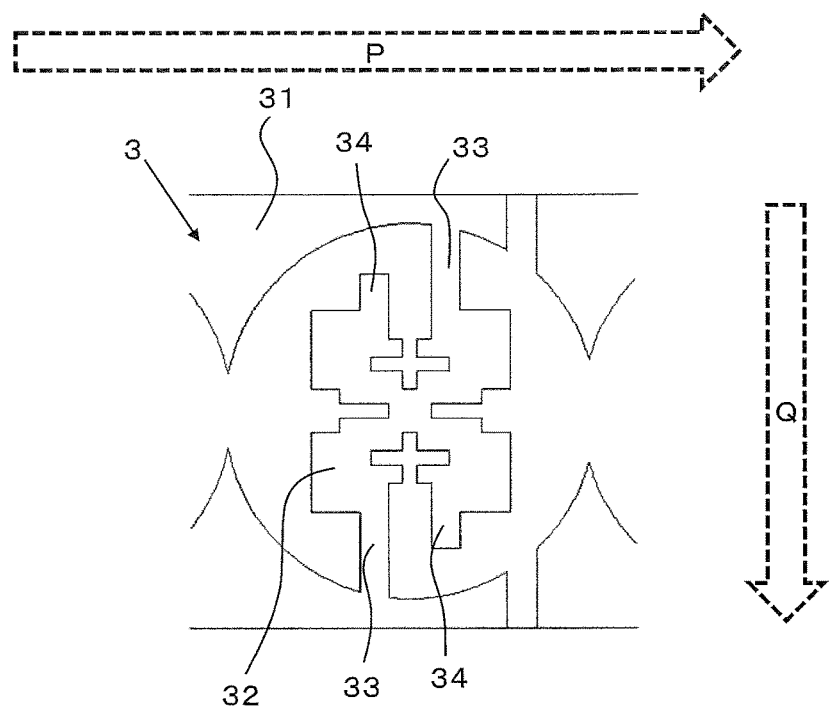
FIG. 6C is an enlarged view of the conductive members according to the second embodiment of the present disclosure.

In the conductive member 3 shown in FIG. 6C, two wire-connected portions 31 are coupled to the element mounting portion 32 via respective ones of the coupling portions 33. The two coupling portions 33 arranged offset to each other with respect to the center of the element mounting portion 32, and the two extending portions 34 are arranged offset to each other with respect to the center of the element mounting portion 32. The coupling portions 33 and the extending portions 34 extend on the same straight line in the second direction Q.

Exemplary Application

Figure 7:
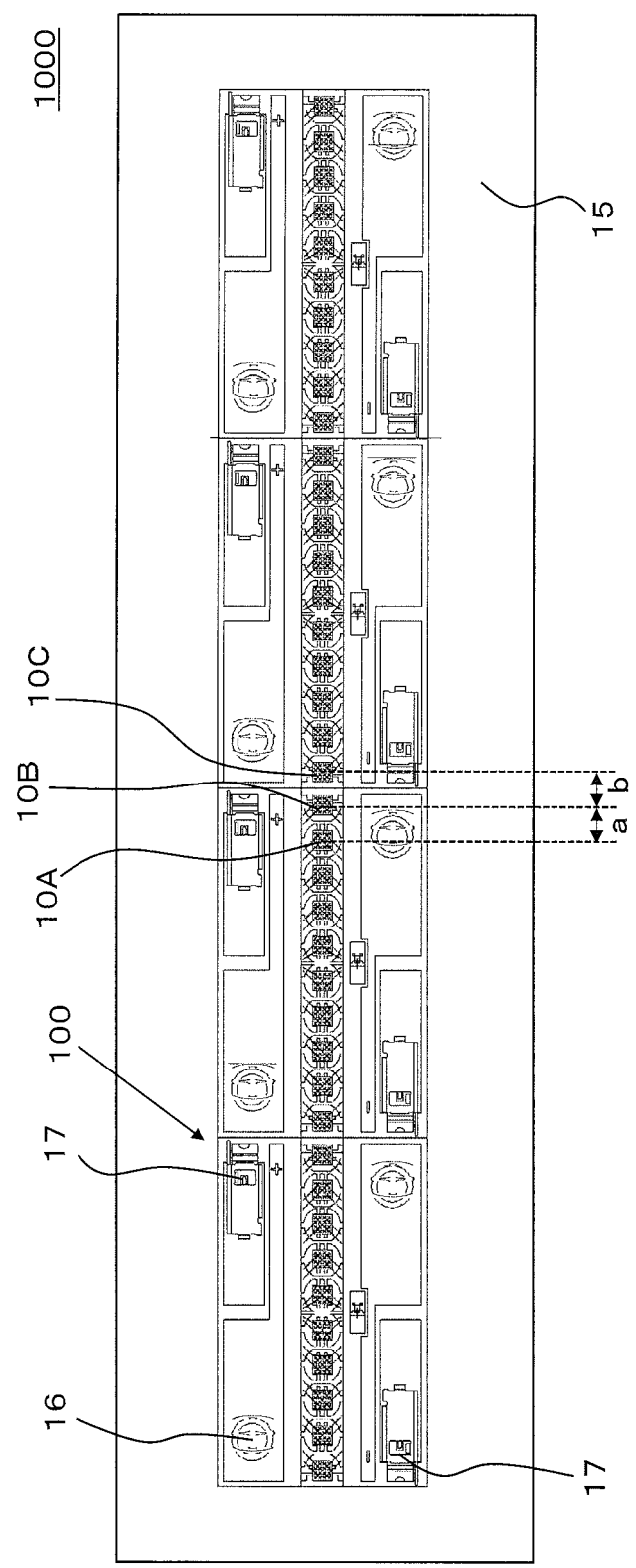
FIG. 7 is a schematic top view showing a light source device according to an exemplary application of the present disclosure.

Next, with reference to FIG. 7, a description will be given of an exemplary application of the light emitting device 100. In the present exemplary application, a description will be given of a light source device 1000 that includes a plurality of light emitting device 100. The light source device 1000 includes a mount 15 that elongates in the first direction P, and a plurality of (four) light emitting devices 100 arranged in a line on the mount 15.

The mount 15 has screw holes for fixing screws 16 inserted into fixing holes, which are provided at the substrate 1 for mounting the light emitting devices 100. Further, cables for supplying power from an external source are respectively connected to respective one of connectors 17 of each of the light emitting devices 100.

In each of the light emitting devices 100, the light emitting elements 10 are disposed to reach the region near the ends of the substrate 1 in the X-axis direction. Accordingly, with the light source device 1000 in which a plurality of light emitting devices 100 is coupled together in the X-axis direction, variation in the amount of light at a boundary between adjacent light emitting devices 100 can be reduced, so that light of linear illumination with high uniformity in the amount of light can be produced. Further, an interval a between two adjacent light emitting elements 10A and 10B mounted on one light emitting device 100 (i.e., the distance between the center of the light emitting element 10A and the center of the light emitting element 10B) is preferably the same with an interval b between the light emitting element 10B mounted at an end portion of one of the light emitting devices 100 and a light emitting element 10C that is mounted on adjacent one of the light emitting devices 100 at an end portion thereof closer to the light emitting element 10B and adjacent to the light emitting element 10B. With this structure, unevenness in the amount of light at the boundary between the light emitting devices 100 can be further reduced.

In a plan view, the connectors 17 having positive and negative power supply terminals, respectively, are respectively disposed at one end portion of each of the light emitting devices 100 in the direction (the Y-axis direction) perpendicular to the arrangement direction (the X-axis direction) of the light emitting devices 100. With this arrangement, each of the connectors 17 of each of the light emitting devices 100 is aligned on one end side of the mount 15. Such an arrangement allows for preventing wirings from the connectors 17 in the light source device 1000 from being complicated.

With the light emitting devices 100 including the light emitting elements 10 configured to emit ultraviolet light, the light source device 1000 can be suitably used for, for example, curing resin, or drying ink for a printer using ink.

In the description above, a light emitting device is illustrated in accordance with the embodiments for carrying out the present invention, but the scope of the invention is not limited to the above description, and should be widely understood based on the scope of the claims. Further, it will be obvious that various changes and modifications can be made therein based on the above description without departing from the scope of the invention.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

What is claimed is:

1. A light emitting device comprising:
    a substrate;
    a conductive member array including a plurality of conductive members arranged on an upper surface of the substrate in a first direction, each of the plurality of conductive members including:
    a coupling portion,
    an element mounting portion having a substantially rectangular outermost shape defined by an insulating member surrounding the periphery thereof, the rectangular outermost shape having four corners corresponding to the substantially rectangular shape of a light emitting element, the element mounting portion having a first lateral surface and a second lateral surface opposite to the first lateral surface, the element mounting portion connected to said coupling portion via the first lateral surface, and
    a controlling portion on the second lateral surface of the element mounting portion;
    the light emitting elements respectively arranged on the element mounting portion of each of the plurality of conductive members; and
    bonding members respectively bonding the element mounting portion to respective one of the light emitting elements,
    wherein said controlling portion allows for generating a stress in a direction opposite to a stress pulling a respective one of the light emitting elements toward the coupling portion when the respective one of the light emitting elements is mounted on the element mounting portion via a respective one of the bonding members,
    wherein the coupling portion is provided on one side of the element mounting portion other than the corners, and the controlling portion is provided on the opposite side of the element mounting portion other than the corners,
    wherein each of the conductive members includes a plurality of the coupling portions and a plurality of the extending portions, and
    wherein each of the plurality of the coupling portions and the plurality of the extending portions are arranged in the first direction parallel to each other.

2. The light emitting device, according to claim 1, wherein said controlling portion is an extending portion that extends from the second lateral surface of the element mounting portion.

3. The light emitting device according to claim 2, wherein the extending portion and the coupling portion extend on a same straight line.

4. The light emitting device according to claim 3, wherein the extending portion has a shape asymmetric to a shape of the coupling portion with respect to the element mounting portion.

5. The light emitting device according to claim 1, wherein, in the conductive member array, a respective one of the coupling portions, the element mounting portion, and a respective one of the extending portions are repeatedly arranged continuously in this order.

6. The light emitting device according to claim 5, wherein the conductive member array is configured to supply electricity to the light emitting elements.

7. The light emitting device according to claim 6, wherein each of the conductive members further includes a wire-connected portion for connecting one or more wires.

8. The light emitting device according to claim 1, wherein said controlling portion extends in a second direction opposite to the first direction.

9. A light emitting device comprising:
    a substrate;
    a conductive member array including a plurality of conductive members arranged on an upper surface of the substrate in a first direction, each of the plurality of conductive members including:
    a coupling portion,
    an element mounting portion having a substantially rectangular outermost shape defined by an insulating member surrounding the periphery thereof, the rectangular outermost shape having four corners corresponding to the substantially rectangular shape of a light emitting element, the element mounting portion having a first lateral surface and a second lateral surface opposite to the first lateral surface, the element mounting portion connected to said coupling portion via the first lateral surface, and
    an extending portion extending from the second lateral surface of the element mounting portion and having a shape asymmetric to the coupling portion with respect to the element mounting portion; and
    the light emitting elements respectively arranged on the element mounting portion of each of the plurality of conductive members,
    wherein the coupling portion is provided on one side of the element mounting portion other than the corners, and the extending portion is provided on the opposite side of the element mounting portion other than the corners,
    wherein each of the conductive members includes a plurality of the coupling portions and a plurality of the extending portions, and
    wherein each of the plurality of the coupling portions and the plurality of the extending portions are arranged in the first direction parallel to each other.

10. A light emitting device comprising:
    a substrate;
    a conductive member array including a plurality of conductive members arranged on an upper surface of the substrate in a first direction, each of the plurality of conductive members including, in order of:
    a coupling portion,
    an element mounting portion having a substantially rectangular outermost shape defined by an insulating member surrounding the periphery thereof the rectangular outermost shape having four corners corresponding to the substantially rectangular shape of a light emitting element, the element mounting portion connected to said coupling portion, and an extending portion connected to said element mounting portion; the light emitting elements respectively arranged on the element mounting portion of each of the plurality of conductive members; and bonding members respectively bonding the element mounting portion to respective one of the light emitting elements, wherein said coupling portion and said extending portion extend on a same straight line, wherein the coupling portion is provided on one side of the element mounting portion other than the corners, and the extending portion is provided on the opposite side of the element mounting portion other than the corners, wherein the element mounting portion includes a first periphery and a second periphery parallel to each other with respect to the first direction, and wherein the element mounting portion forms:

one or more second recesses in a region including the first periphery and/or a region including the second periphery, and a groove continuous with each of said one or more second recesses.

11. The light emitting device according to claim 10, wherein said coupling portion and said extending portion extend in the first direction.

12. The light emitting device according to claim 10, wherein, in a top view, a portion of said coupling portion connected to the element mounting portion has a width in a second direction that is the same with a width of a portion of said extending portion connected to the element mounting portion in the second direction, the second direction perpendicular to the first direction.

13. The light emitting device according to claim 10, wherein said extending portion includes a first extending portion and a second extending portion.

14. The light emitting device according to claim 13, wherein the first extending portion has a length in the first direction greater than a length of the first extending portion in a second direction perpendicular to the first direction, and wherein the second extending portion has a length in the first direction greater than a length of the second extending portion in the second direction.

15. The light emitting device according to claim 13, wherein the first extending portion includes a first side facing the second extending portion, wherein the second extending portion includes a first side facing the first extending portion, and wherein the first side of the first extending portion is parallel to the first side of the second extending portion with respect to the first direction.

16. A light emitting device comprising:

a substrate;

a conductive member array including a plurality of conductive members arranged on an upper surface of the substrate in a first direction, each of the plurality of conductive members including:

two coupling portions, an element mounting portion having a substantially rectangular outermost shape defined by an insulating member surrounding the periphery thereof, the rectangular outermost shape having four corners corresponding to the substantially rectangular shape of a light emitting element, the element mounting portion connected to the two coupling portions, and two extending portions connected to the element mounting portion; the light emitting elements respectively arranged on the element mounting portion of each of the plurality of conductive members; and bonding members respectively bonding the element mounting portion to respective one of the light emitting elements, wherein each of the two coupling portions extends in a second direction perpendicular to the first direction, wherein the coupling portions and the extending portions are provided on sides of the element mounting portion other than the corners, wherein the two extending portions extend in a same straight line that extends in the second direction, wherein one of the two extending portions and one of the two coupling portions are disposed at a lateral surface of the element mounting portion, and wherein the other of the two extending portions and the other of the two coupling portions are disposed at another lateral surface of the element mounting portion.

* * * * *